(12) United States Patent
Moise et al.

(10) Patent No.: US 6,441,415 B1
(45) Date of Patent: Aug. 27, 2002

(54) FERROELECTRIC AND PARAELECTRIC THIN FILM DEVICES USING DOPANTS WHICH ELIMINATE FERROELECTRICITY

(75) Inventors: Theodore S. Moise; Stephen R. Gilbert, both of Dallas, TX (US); Charles D. E. Lakeman, Albuquerque, NM (US); Scott R. Summerfelt, Garland; Stacey A. Yamanaka, Dallas, both of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/344,580

(22) Filed: Jun. 25, 1999

(51) Int. Cl.[7] .......................... H01L 29/76; H01L 29/94; H01L 31/062; H01L 31/113; H01L 31/119
(52) U.S. Cl. ...................... 257/295; 257/310; 365/145; 438/3; 438/240
(58) Field of Search ................. 257/295, 310; 365/145; 438/3, 240

(56) References Cited

U.S. PATENT DOCUMENTS

| | | | | |
|---|---|---|---|---|
| 5,516,363 A | * | 5/1996 | Azuma et al. | 106/287.18 |
| 5,689,456 A | * | 11/1997 | Kobayashi | 3654/145 |
| 5,796,648 A | * | 8/1998 | Kawakubo | 365/145 |
| 5,969,892 A | * | 10/1999 | Koo | 365/145 |

* cited by examiner

*Primary Examiner*—Howard Weiss
(74) *Attorney, Agent, or Firm*—Carlton H. Hoel; W. James Brady; Frederick J. Telecky, Jr.

(57) ABSTRACT

A method for simultaneously producing areas of paraelectric states and areas of ferroelectric states on a single thin film layer, thereby reducing the number of processing steps required to produce integrated chips containing both standard capacitors and non-volatile memory devices from the number of steps needed using the conventional approach. A device containing both ferroelectric capacitors and non-ferroelectric capacitors using a single thin film as the dielectric.

5 Claims, 5 Drawing Sheets

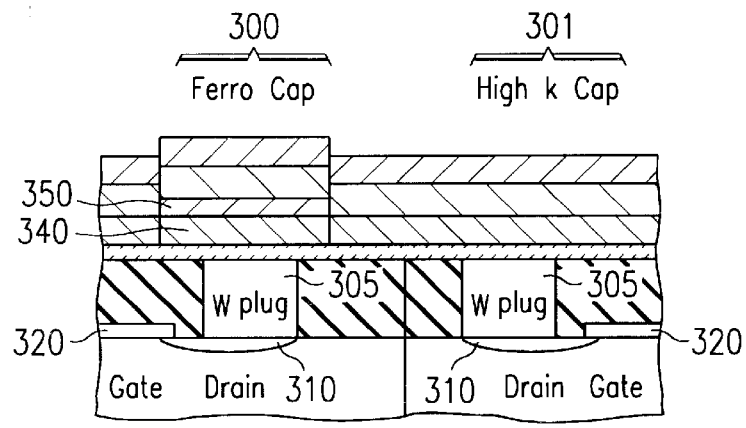
FIG. 3d
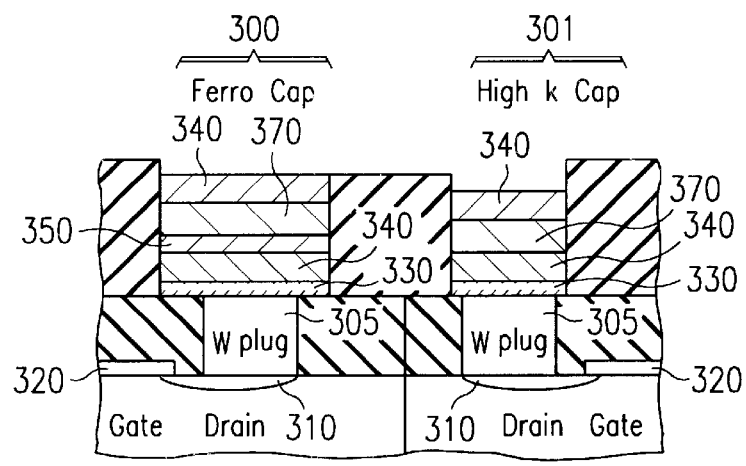
FIG. 3e
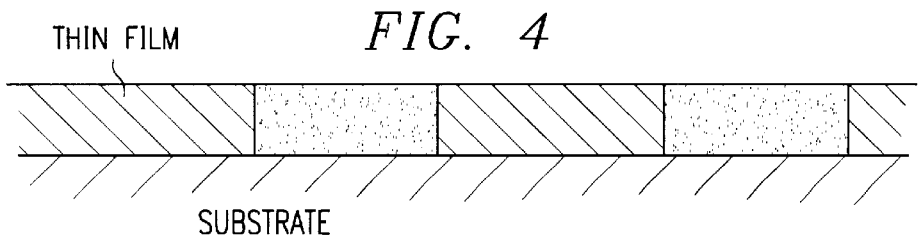
FIG. 4
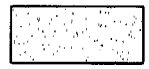 PARAELECTRIC AREAS
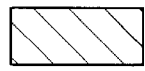 FERROELECTRIC AREAS

POLARIZATION CURVE AS A FUNCTION OF ELECTRIC FIELD FOR A FERROELECTRIC

POLARIZATION CURVE AS A FUNCTION OF ELECTRIC FIELD FOR A PARAELECTRIC

FERROELECTRIC AND PARAELECTRIC THIN FILM DEVICES USING DOPANTS WHICH ELIMINATE FERROELECTRICITY

BACKGROUND AND SUMMARY OF THE INVENTION

The present invention relates to integrated circuit structures and fabrication methods and in particular to methods of forming ferroelectric and high-k paraelectric dielectrics simultaneously on a single thin-film layer on an integrated circuit chip.

High-k Dielectric Materials

The electric susceptibility, k, is a parameter which measures the ease of polarization of a material. Polarization measures the extent to which the positive and negative charges in a material are separated. Electrically, it looks like a capacitor where the charge stored increases as the applied voltage increases. The basis for high-k materials is a large polarizability with applied electric field. Dielectrics with values of k exceeding 50 are considered high-k dielectrics.

The capacitance of a capacitor with a given plate separation is directly proportional to k and to the surface area of the device. Thus, as k increases, the surface area of the capacitor may be decreased while still maintaining the same capacitance. Therefore, the higher the k value of the material used to construct the capacitor, the more densely the capacitors can be packed on an integrated circuit chip.

Ferroelectric Memories

Although high-k dielectrics are useful for standard capacitors, they are impractical for non-volatile memory devices. However, the materials which are known as ferroelectrics are ideal for such devices. Ferroelectric materials are extremely varied, however, they have certain properties in common, which as the name suggests, are like electrical analogs to the magnetic properties of ferromagnetic substances. One important property is that once a ferroelectric material has been polarized in one direction by the application of an external electric field, it will hold that polarization for a long time, thus providing non-volatile storage of information. (That is, the memory will retain its information even if it is not receiving any power supply voltage.) This is referred to as hysteresis behavior. (See FIG. 7 for a diagram of the polarization of a ferroelectric as a function of applied electric field.)

Paraelectric States

Ferroelectricity usually disappears above a certain temperature called the Curie temperature, critical temperature or transition temperature. Above the transition temperature the crystal is said to be in a paraelectric state. The term paraelectric suggests an analogy with paramagnetism and implies a rapid decrease in the dielectric constant as the temperature increases.

As noted earlier, one property which all ferroelectrics possess is that of having a permanent electrical polarization. This permanent electrical polarization is a product of the fact that the energy curve for ferroelectrics has two minima. (See FIG. 6 for a diagram of the energy curves of ferroelectric materials. The material is ferroelectric below the transition temperature and is paraelectric above the transition temperature.) Each minimum corresponds to a polarized state. Because there is an energy barrier between the two minima, the polarization of the ferroelectric will not change until an applied electric field reaches a certain threshold level sufficient to raise the energy of the ferroelectric above the energy barrier.

Paraelectrics, however, have only one energy minimum. Because of this, a material in the paraelectric state does not exhibit a hysteresis curve. Therefore, a paraelectric becomes polarized when an external electric field is applied. However, unlike a ferroelectric, when the external field is removed, a paraelectric returns to its unpolarized state. See FIG. 7 and FIG. 8 to see the contrast between the polarization of a ferroelectric and a paraelectric in the presence of an applied electric field.

General

As the semiconductor industry moves toward lower operating voltage and higher density, new materials must be introduced to provide the requisite dielectric properties. For example, high-k materials (such as Barium Strontium Titanate "BST") are promising candidates for capacitors, and ferroelectric materials (such as $SrBi_2Ta_2O_9$ "SBT" or $Pb(Zr,Ti)O_3$ "PZT") may be used for non-volatile memory applications.

The dielectric properties of ferroelectric crystals can be significantly altered by standard processing steps such as implantation, annealing, or composition modification. In general, the ferroelectric phase can be frustrated such that the crystal forms a high-k (>50) dielectric rather than a ferroelectric. It is also possible to alter the dielectric properties of paraelectric crystals such that a ferroelectric crystal is created from high-k crystals by standard processing steps such as Bi loading.

Innovative Structures and Methods

Since many applications require both standard capacitor elements and non-volatile memory capacitors on a single chip, it is important to identify a method by which both types of elements can be realized with a minimum of processing steps. Conventional approaches include the fabrication of separate ferroelectric and "standard" capacitor elements. The present application discloses a method for the simultaneous development of non-volatile memory elements and high-k capacitors on a single chip. In addition, the present application discloses a capacitor containing a single thin-film layer which has areas of both ferroelectric states and high-k paraelectric states (See FIG. 4).

Advantages of the disclosed methods and structures include: integrating both high-k and non-volatile capacitor elements on a single chip using a minimum of processing steps. Applications for this process include: co-integration of high-density dynamic random access memory (DRAM) and ferroelectric random access memory (FeRAM) cells; voltage-tunable, large decoupling capacitors for RF along with FeRAM memory elements.

BRIEF DESCRIPTION OF THE DRAWINGS

The disclosed inventions will be described with reference to the accompanying drawings, which show important sample embodiments of the invention and which are incorporated in the specification hereof by reference, wherein:

FIG. 3d depicts the structure of FIG. 3c after deposition of paraelectric film and the electrode structure.

FIG. 3e depicts the structure of FIG. 3d after etching and annealing capacitors.

FIG. 4, is a diagram of a single thin-film containing both ferroelectric areas and paraelectric areas.

DETAILED DESCRIPTION OF THE PREFERRED EMBODIMENTS

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Process Overview

Figure 1:
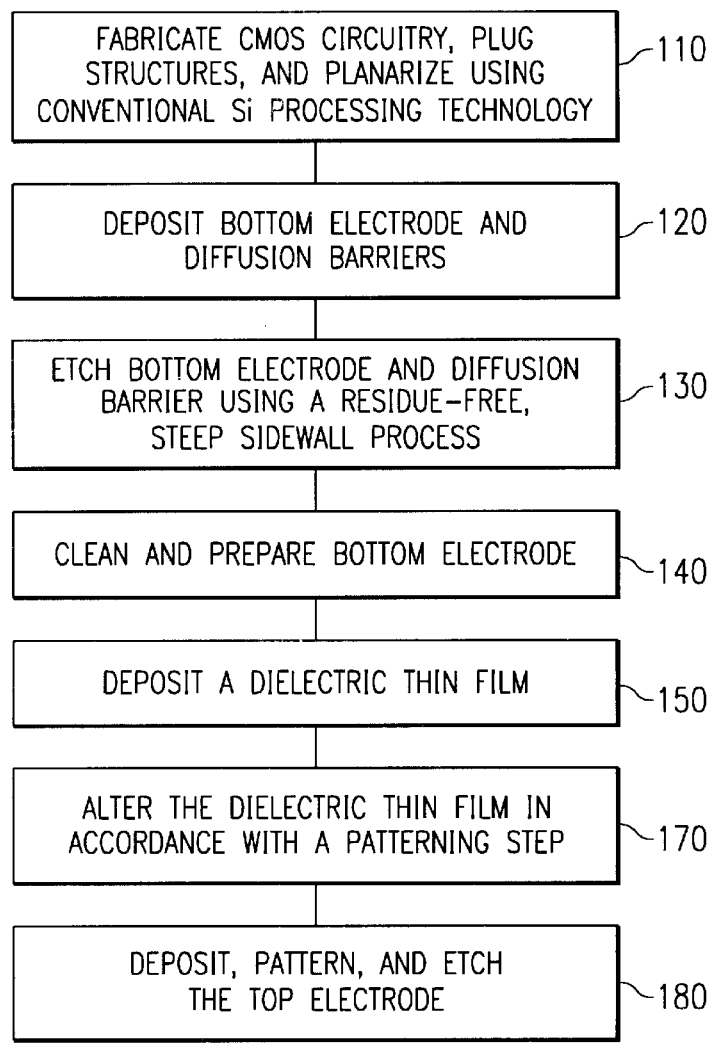
FIG. 1 is a flow chart showing key steps in fabricating a thin-film layer with both ferroelectric areas and paraelectric areas.

One possible flow for the simultaneous development of non-volatile memory elements and high-k capacitors is outlined as follows. A flow chart of this method is shown in FIG. 1. Fabricate CMOS circuitry, plug structures, and planarize using conventional Si processing technology (step 110). Follow this step by depositing bottom electrode and diffusion barriers (step 120).

The next step in the process is to etch the bottom electrode and diffusion barrier using a residue-free, steep sidewall process (step 130). After cleaning and preparing the bottom electrode (step 140), deposit a ferroelectric thin film (step 150). The ferroelectric thin film is typically crystallized following deposition - except in the case of chemical vapor deposition (CVD).

Next, the sample is masked using conventional photolithography. A photoresist, metal mask, or alternative can be used. The mask itself may serve as a barrier for implant or diffusion. In the unmasked (clear) areas, the ferroelectric thin film is altered to create high-k film (step 170).

Next, the top electrode, selected from the same class of materials as the bottom electrode, is deposited, patterned, and etched followed by deposition of a top electrode dielectric layer (step 180). Precautions may be needed to limit the reaction of this film with the ferroelectric film. Following a via etch, an interconnect metal film is deposited and patterned.

Figure 2A:
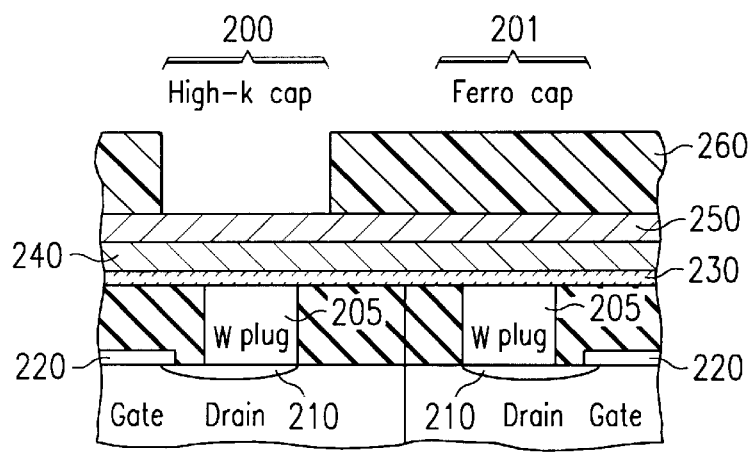
FIG. 2a depicts the starting structure for the process using ferroelectric film as the initial film.
Figure 2B:
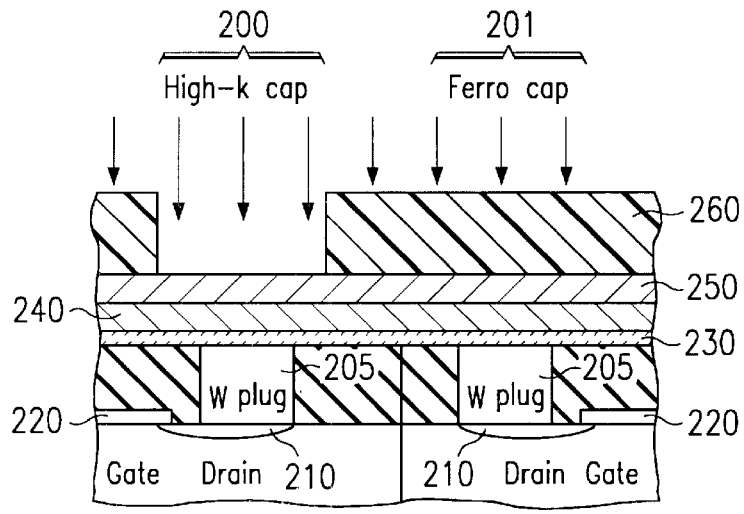
FIG. 2b depicts the structure of FIG. 2a after implantation.
Figure 2C:
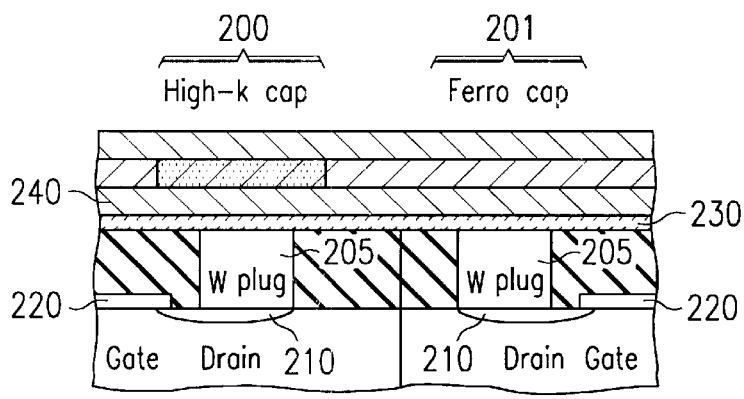
FIG. 2c depicts the structure of FIG. 2b after depositing the top electrode.
Figure 2D:
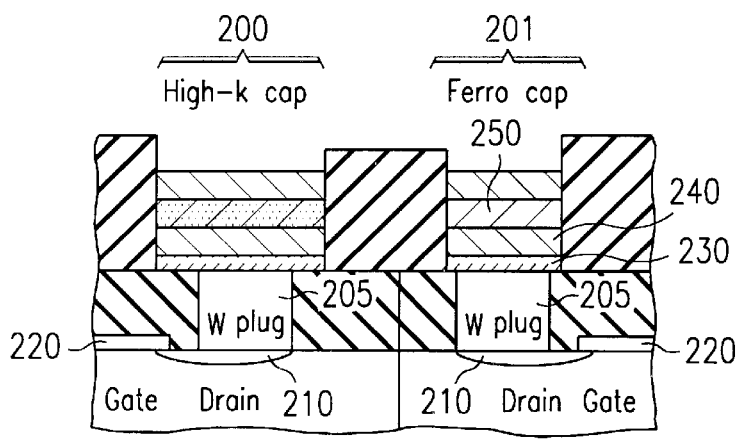
FIG. 2d depicts the structure of FIG. 2c after etching and annealing the capacitors.

Preferred Embodiment: Process for Fabricating Ferroelectric and High-k Capacitors from Ferroelectric Film The starting structure for this process is the transistor (drain 210 and gate 220) and plug 205 formation as depicted in FIG. 2a. TiAlN diffusion barriers 230 and platinum electrodes 240 are deposited FIG. 2a. The $Pb(ZrTi)O_3$ ferroelectric film 250 is deposited using spin-on (solvent based) technique FIG. 2a. Photoresist 260 is used to define the capacitor areas FIG. 2a. Following the photoresist 260, implant the $Pb(ZrTi)O_3$ ferroelectric film 250 with a lanthanum (La) dopant, clear resist and anneal at 500–700 degrees celsius FIG. 2b. The dopant will eliminate the remnant polarization leaving the film as a high-k device. Next, deposit the top platinum electrode structure 240 FIG. 2c. Etch and anneal the capacitors 200 and 201 FIG. 2d. Deposit interlayer dielectric, TiN adhesion layer and Al interconnect metal and then etch the metal layer. Continue the interconnect process to form the remainder of the circuits.

Alternative Embodiment: $SrBi_2Ta_2O_9$ Ferroelectric Thin Film

In an alternate embodiment, the ferroelectric film 250 is $SrBi_2Ta_2O_9$.

Alternative Embodiment: Implantation with Titanium

In an alternate embodiment, the dopant species in the implantation process is titanium (Ti).

Alternative Embodiment: Implantation with Tantalum

In an alternate embodiment, the dopant species in the implantation process is tantalum (Ta).

Alternative Embodiment: Implantation with Manganese

In an alternate embodiment, the dopant species in the implantation process is manganese (Mn).

Alternative Embodiment: Implantation with Niobium

In an alternate embodiment, the dopant species in the implantation process is niobium (Nb).

Alternative Embodiment: Implantation with Calcium

In an alternate embodiment, the dopant species in the implantation process is calcium (Ca).

Alternative Embodiment: Implantation with Ytterbium

In an alternate embodiment, the dopant species in the implantation process is ytterbium (Yb).

Alternative Embodiment: Implantation with Barium

In an alternate embodiment, the dopant species in the implantation process is barium (Ba).

Alternative Embodiment: Implantation with Hafnium

In an alternate embodiment, the dopant species in the implantation process is hafnium (Hf).

Alternative Embodiment: H₂ Annealing Process

In an alternate embodiment, rather than altering the ferroelectric film with an implantation process, the ferroelectric film 250 is altered by $H_2$ annealing which degrades crystalline properties to create a high-k film.

Figure 3A:
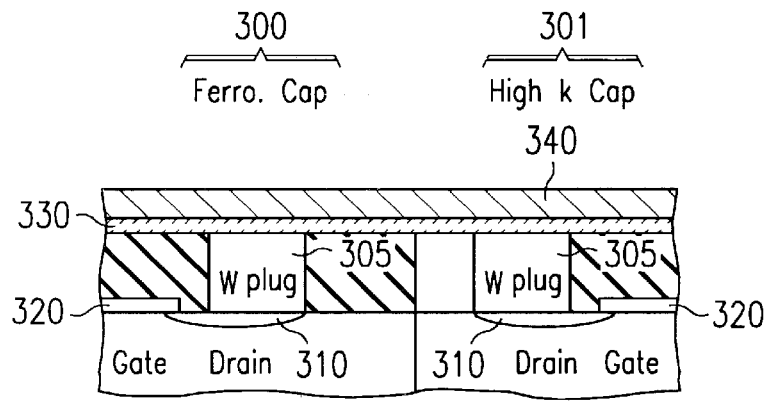
FIG. 3a depicts the starting structure for the process using a high-k dielectric as the initial film.
Figure 3B:
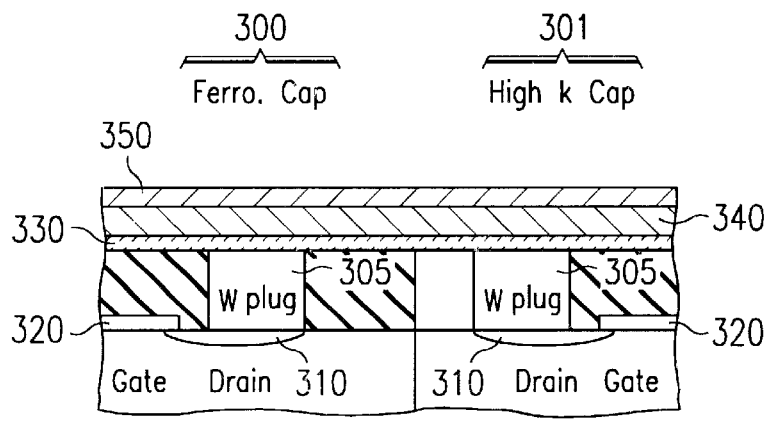
FIG. 3b depicts the structure of FIG. 3a after bismuth loading.
Figure 3C:
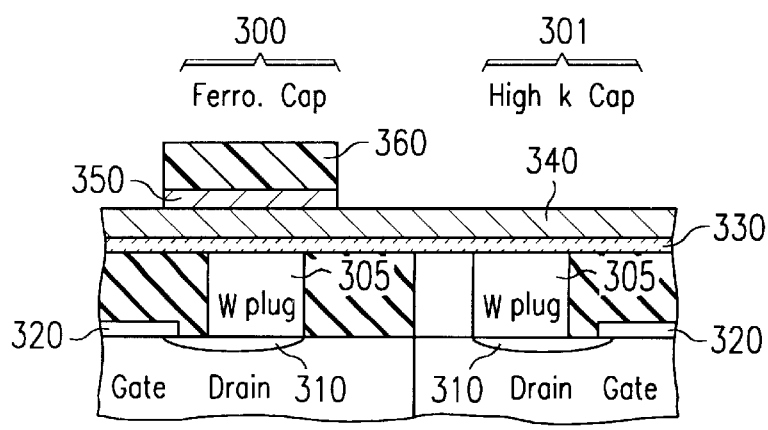
FIG. 3c depicts the structure of FIG. 3b after the bismuth coated film has been patterned.

Alternative Embodiment: Process for Fabricating Ferroelectric and High-k Capacitors from High-k Film In an alternate embodiment, the initial film is barium strontium titanate (BST), a high-k material, which is altered to create ferroelectric areas. The starting structure for the process is a transistor (drain 310 and gate 320) and plug 305 formation with TiAlN diffusion barriers 330 and platinum (Pt) electrodes 340 deposited as shown in FIG. 3*a*. Next, the platinum (Pt) electrode 340 is loaded with bismuth (Bi) FIG. 3*b*. This is accomplished by spin-coating the electrode 340 using a Bi solution, baking at 300 degrees celsius and firing at 700 degrees celsius. The film thickness should be less than 5nm. Pattern and etch the Bi coated film 350 using photoresist 360 and buffered oxide etch (BOE) processes FIG. 3*c*. Follow this step by depositing $SrBi_2Ta_2O_9$ (SBT) film 370, a ferroelectric film, using a spin-on technique FIG. 3*d*. Crystallize and deposit top electrode 340 structure FIG. 3*d*. The next step in the process is to etch and anneal the capacitors 300 and 301 FIG. 3*e*. The high k capacitor 301 will have a Bi deficiency which will significantly reduce or eliminate the remnant polarization. Deposit the interlayer dielectric, the TiN adhesion layer, and the aluminum (Al) interconnect metal. Etch the metal layer and continue the interconnect process to form the remainder of the circuits.

Alternative Embodiment: Pb loading

In an alternate embodiment, bismuth (Bi) is replaced by lead (Pb).

Device Overview

FIG. 4 depicts a single thin-film layer 400, containing both ferroelectric areas 420 and paraelectric areas 410, which is deposited on a substrate 430.

Alternate Embodiment: Non-volatile Memory and Standard Capacitor Elements

Figure 5:
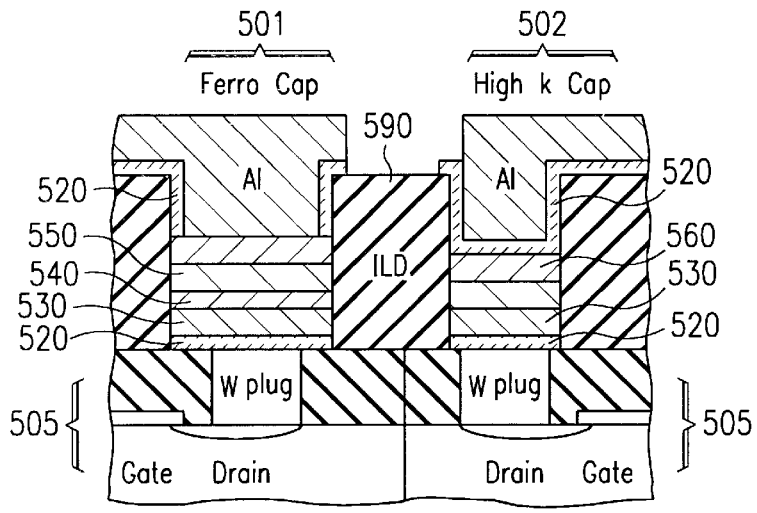
FIG. 5 is a cross section diagram of a chip with co-integration of non-volatile memory elements and standard capacitor elements.
Figure 6:
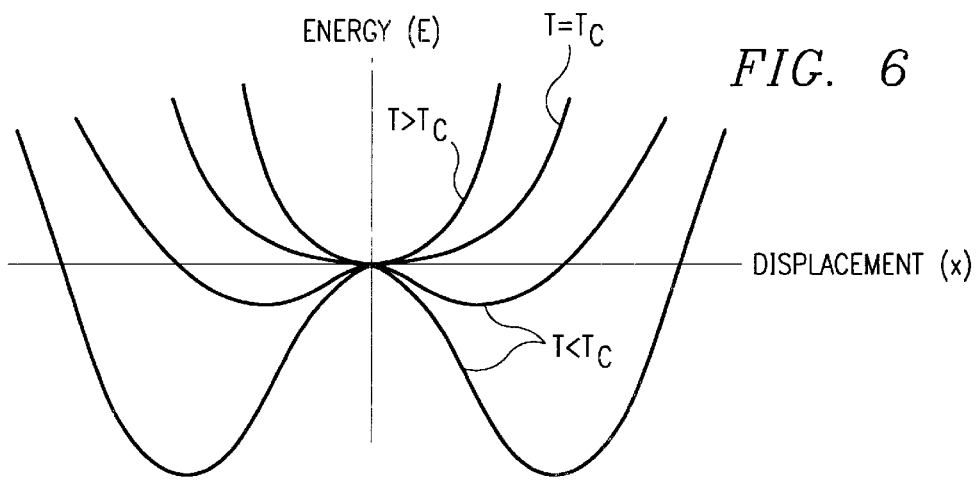
FIG. 6 is a diagram of energy (E) of ferroelectric as a function of displacement (x), for several values of the temperature, both above and below the critical temperature $T_c$.
Figure 7:
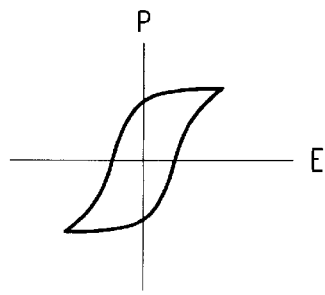
FIG. 7 is a diagram of polarization as a function of applied electric field for a ferroelectric.
Figure 8:
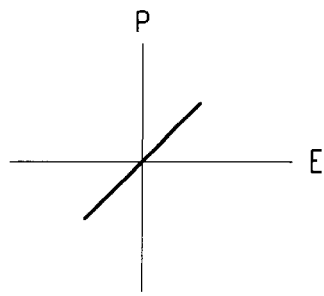
FIG. 8 is a diagram of polarization as a function of applied electric field for a paraelectric.

In an alternate embodiment, the ferroelectric areas of the film are used to form the dielectric between the plates of non-volatile memory elements and the paraelectric areas of the film are used to form the dielectric between the plates of standard capacitor elements as shown in FIG. 5. As depicted in FIG. 5, a paraelectric film 560 lies between two platinum capacitor plates. The bottom electrode plate 530 of the non-volatile memory device 501 is coated with bismuth which changes the paraelectric film 560 into ferroelectric film. The standard capacitor 502 and the non-volatile memory device 501 are separated by an interlayer dielectric 590. The bottom electrode plate 520 sits atop a diffusion barrier 520 which sits atop a plug and transistor structure 505.

According to a disclosed class of innovative embodiments, there is provided: an integrated chip comprising a dielectric layer formed from a single thin film dielectric layer containing both ferroelectric areas and paraelectric areas.

According to another disclosed class of innovative embodiments, there is provided: an integrated chip containing both non-ferroelectric capacitor devices and ferroelectric memory devices, wherein the dielectric for both said non-ferroelectric capacitor devices and said ferroelectric memory devices is formed from a single thin-film dielectric layer.

According to another disclosed class of innovative embodiments, there is provided: a method of fabricating a dielectric layer, comprising the steps of: (a.) forming a single thin film dielectric layer; and (b.) performing selective treatment of some portions of said dielectric such that thereafter, said dielectric layer consists of some portions which are ferroelectric and some portions which are paraelectric.

According to another disclosed class of innovative embodiments, there is provided: a method of fabricating a capacitor such that the dielectric separating the plates of said capacitor contains both ferroelectric and paraelectric areas, comprising the steps of: (a.) forming a bottom plate; (b.) forming a dielectric layer overall; (c.) performing selective treatment of some portions of said dielectric such that thereafter, said dielectric consists of some portions which are ferroelectric and some portions which are paraelectric; and (d.) forming a top plate.

According to another disclosed class of innovative embodiments, there is provided: a method of forming both ferroelectric memory devices and non-ferroelectric capacitors with a single deposition, comprising the actions of: (a.) forming a partially fabricated integrated circuit which includes the bottom plates of non-ferroelectric capacitors and the bottom plates of ferroelectric memory devices; (b.) forming a dielectric overall; (c.) performing selective treatment of portions of said dielectric, so that thereafter said dielectric is ferroelectric over at least some of said bottom plates of ferroelectric memory devices and paraelectric over at least some of said bottom plates of non-ferroelectric capacitors; and (d.) completing fabrication of said non-ferroelectric capacitors and said ferroelectric memory devices.

Modifications and Variations

As will be recognized by those skilled in the art, the innovative concepts described in the present application can be modified and varied over a tremendous range of applications, and accordingly the scope of patented subject matter is not limited by any of the specific exemplary teachings given, but is only defined by the issued claims.

The platinum electrodes could be replaced by iridium (Ir), ruthenium (Ru), $SrRuO_3$, or $IrO_2$ electrodes. The TiAlN diffusion barrier could be replaced with a TiN diffusion barrier. The ferroelectric film could be deposited using a sputter method or chemical vapor deposition (CVD) rather than using a solvent based spin-on technique. Other ferroelectrics and paraelectric materials could be used in place of those described.

It should be noted that there are many uses for ferroelectric capacitors and non-ferroelectric capacitors, and accordingly the scope of patented subject matter is not limited by any of the specific exemplary teachings given, but is only defined by the issued claims.

What is claimed is:

1. An integrated chip comprising a dielectric layer formed from a single thin film dielectric layer containing both ferroelectric areas and paraelectric areas, wherein said dielectric layer in said paraelectric areas also contains dopants which eliminate ferroelectricity.

2. The integrated chip of claim 1, wherein said thin-film dielectric layer is a perovskite compound.

3. The integrated chip of claim 1, wherein said thin-film dielectric layer is discontinuous.

4. An integrated chip containing both non-ferroelectric capacitor devices and ferroelectric memory devices, wherein the dielectric for both said non-ferroelectric capacitor devices and said ferroelectric memory devices is formed from a single thin-film dielectric layer, and wherein said dielectric layer in said non-ferroelectric capacitor devices also contains dopants which eliminate ferroelectricity .

5. The integrated chip of claim 4, wherein said thin-film dielectric layer is a perovskite compound.

* * * * *